United States Patent
Layh et al.

(10) Patent No.: US 9,176,390 B2
(45) Date of Patent: Nov. 3, 2015

(54) METHOD FOR ADJUSTING AN ILLUMINATION SYSTEM OF A PROJECTION EXPOSURE APPARATUS FOR PROJECTION LITHOGRAPHY

(75) Inventors: Michael Layh, Aalen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 812 days.

(21) Appl. No.: 13/421,024

(22) Filed: Mar. 15, 2012

(65) Prior Publication Data
US 2012/0242968 A1 Sep. 27, 2012

Related U.S. Application Data

(60) Provisional application No. 61/466,084, filed on Mar. 22, 2011.

(30) Foreign Application Priority Data

Mar. 22, 2011 (DE) .......................... 10 2011 005 881

(51) Int. Cl.
*G03B 27/68* (2006.01)
*G03B 27/52* (2006.01)
(Continued)

(52) U.S. Cl.
CPC ............ *G03F 7/70075* (2013.01); *G03F 7/702* (2013.01); *G03F 7/70083* (2013.01); *G03F 7/70191* (2013.01)

(58) Field of Classification Search
CPC ............ G03F 7/70075; G03F 7/70083; G03F 7/70191; G03F 7/702; G03F 7/70133; G03F 7/70141; G03F 7/7085; G03F 7/70558; G03F 7/70591; G03F 7/70666

USPC ........ 355/52, 53, 55, 67–71, 77; 430/5, 8, 22, 430/30, 311, 312, 322; 250/492.1, 492.2, 250/492.22; 359/378–379

See application file for complete search history.

(56) References Cited

U.S. PATENT DOCUMENTS 6,013,401 A  1/2000 McCullough et al.
6,658,084 B2 * 12/2003 Singer ............................. 378/34
(Continued)

FOREIGN PATENT DOCUMENTS

DE       102 20 815 A1    11/2002
DE    10 2004 033 350 A1    2/2006
(Continued)

OTHER PUBLICATIONS

"Handbook of optical systems: vol. 2, Physical image formation, chapter 2.1, the Abbe theory of imaging", Wiley VCH 2005.
(Continued)

*Primary Examiner* — Christina Riddle
(74) *Attorney, Agent, or Firm* — Fish & Richardson P.C.

(57) ABSTRACT

A method includes moving a correction device into a neutral position; subsequently ascertaining, for a given arrangement of imaging light channels in the illumination optical unit of the projection exposure apparatus, intensity distributions of at least some of the individual imaging light partial beams along a transverse coordinate transverse to a displacement direction of an object to be imaged; subsequently ascertaining, in dependence on the transverse coordinate, an actual variation of actual values of structure image sizes of object structures in an image field, onto which the object is imaged; and subsequently specifying a predetermined variation of the structure image sizes over the transverse coordinate and displacing correction elements of the correction device, starting from the neutral position, such that the actual variation matches the predetermined variation within a tolerance bandwidth. The method can provide improved imaging results as compared to known uniformity adjustment.

21 Claims, 9 Drawing Sheets

(51) Int. Cl.
*G03B 27/72* (2006.01)
*G03B 27/32* (2006.01)
*G03F 7/20* (2006.01)
*G03B 27/54* (2006.01)

(56) References Cited

U.S. PATENT DOCUMENTS

| | | |
|---|---|---|
| 6,859,515 B2 | 2/2005 | Schultz et al. |
| 7,623,620 B2 | 11/2009 | Mann et al. |
| 2002/0076629 A1* | 6/2002 | Miwa et al. ............... 430/30 |
| 2003/0227603 A1* | 12/2003 | Dierichs ................... 355/47 |
| 2004/0065817 A1 | 4/2004 | Singer et al. |
| 2004/0066496 A1* | 4/2004 | Govil et al. .............. 355/52 |
| 2005/0122502 A1* | 6/2005 | Nemoto ..................... 355/69 |
| 2005/0140957 A1* | 6/2005 | Luijkx et al. ............. 355/71 |
| 2005/0274897 A1* | 12/2005 | Singer et al. ............. 250/372 |
| 2006/0244941 A1* | 11/2006 | Gruner et al. ............ 355/69 |
| 2010/0253926 A1 | 10/2010 | Endres et al. |

FOREIGN PATENT DOCUMENTS

| | | |
|---|---|---|
| DE | 10 2008 013 229 A1 | 3/2008 |
| EP | 0 952 491 A2 | 10/1999 |
| EP | 1 225 481 A2 | 7/2002 |
| WO | WO 2009/074 211 A1 | 6/2009 |

OTHER PUBLICATIONS

German Examination Report with English translation for corresponding DE Appl No. 10 2011 005 881.8, dated Nov. 11, 2011.

* cited by examiner

METHOD FOR ADJUSTING AN ILLUMINATION SYSTEM OF A PROJECTION EXPOSURE APPARATUS FOR PROJECTION LITHOGRAPHY

CROSS-REFERENCE TO RELATED APPLICATIONS

This application claims priority under 35 U.S.C. §119(e)(1) to U.S. Provisional Application No. 61/466,084 filed Mar. 22, 2011. This application also benefit under 35 U.S.C. §119 to German Application No. 10 2011 005 881.8, filed Mar. 22, 2011. The contents of both of these applications are hereby incorporated by reference in their entirety.

FIELD

The disclosure relates to a method for adjusting an illumination system of a projection exposure apparatus for projection lithography. Furthermore, the disclosure relates to a device for carrying out the method, an illumination optical unit including such a device, an illumination system including an such illumination optical unit, a projection exposure apparatus including such an illumination system, a method for producing a micro- or nanostructured component using such a projection exposure apparatus, and a component structured by such a method.

BACKGROUND

WO 2009/074 211 A1 discloses a correction device with which a uniform intensity distribution is adjustable within specific tolerance limits over a transverse coordinate transverse to a displacement direction of an object which has been displaced during the projection exposure.

SUMMARY

The disclosure provides an adjustment method for an illumination system for a projection exposure apparatus for projection lithography, which method provide can provide improved imaging results when compared with known uniformity adjustment.

According to the disclosure it has been recognized that optimization of an illumination system to an illumination that is uniform, that is to say is as uniformly intensive over the transverse coordinate transverse to the object displacement direction as possible, in many cases does not result in optimum imaging results. An object field position at a specific transverse coordinate is also referred to as field height. According to the disclosure it has been recognized that the structure image size variation is an optimization variable that is better matched to the desired imaging result. The variation of a critical dimension (CD), ΔCD, can be used as structure image size variation. The structure image size variation is the change in an imaged structure size during projection exposure as a function of a field height, that is to say as a function of the field transverse coordinate transverse to the displacement direction of the object. In addition, the structure image size variation can be dependent on a further object structure image size. The imaged structure size can be a critical dimension (CD). The object structure image size is the size of a distance value in the image plane of a typical reference structure, which is imaged into the image field using the projection optical unit. One example thereof is what is referred to as "pitch," i.e. the distance between two neighboring lines in the image field. The structure image size variation (ΔCD) can be, when line-type object structures are imaged, the variation in a line width, in which an intensity of the imaging light is above a resist threshold intensity, which is used for developing a light-sensitive layer on the substrate or wafer. This line width, that is to say the imaged structure size, can vary over the field height independently of a distance between two neighboring lines, that is to say independently of a pitch of the object structure as an example for the further object structure size. According to the disclosure it has been recognized that an imaging result can be optimized if the structure image size variation over the entire field width is kept as small as possible. The adjustment method according to the disclosure provides, with the correction device operating in dependence on the field height, that is to say operating in dependence on the transverse coordinate, an instrument with which the structure image size variation can be optimized in dependence on the transverse coordinate, that is to say can be brought into agreement with a predetermined specification within specified tolerances. What is utilized here is that the correction elements of the correction device can influence the various imaging light partial beams in different ways since the imaging light partial beams typically do not identically superpose one another along the displacement direction. The disclosure departs from the paradigm that optimum imaging can be achieved only if the intensity of the total imaging light beam is uniform over the field height. Rather, adjustment of the illumination system that is optimized for imaging specific object structures can also accompany a non-uniform intensity distribution over the transverse coordinate, in particular in an object or reticle plane in which the object to be imaged is arranged. The intensity distributions of at least some of the individual imaging light partial beams along the transverse coordinate for a given arrangement of the imaging light channels in the illumination optical unit can be ascertained by simulation or calculation on the basis of the known geometry of the illumination optical unit or of the system containing the illumination optical unit and the projection optical unit. This ascertainment can occur in the object or reticle plane.

Alternatively or in addition, this ascertainment of the intensity distributions can take place by way of measurement. The intensity distributions can be ascertained for each imaging light channel individually. Ascertainment of an effect of a displacement of the correction elements on the individual imaging light partial beams, starting from the neutral position, can likewise occur via simulation or calculation of the optical effect of the correction elements on the basis of the known optical geometry data. Alternatively or in addition, the effect of a displacement of the correction elements is also obtainable via measurement.

The intensity distributions of the imaging light partial beams in an image plane, in which the substrate or the wafer is arranged, can be ascertained using Abbe's theory of imaging. Here simulation programs can be used with which an intensity distribution of each imaging light partial beam can be determined. Simulation programs of this type can take into consideration the effect of a correction device for example in the form of a UNICOM known from DE 10 2008 013 229 A1. The result of the simulation is the intensity distribution of each imaging light partial beam. The overall intensity distribution in the image plane results in the form of superposition of the intensity distributions of all imaging light partial beams. On the basis of the overall intensity distribution, it is then possible to determine the structure image size variation to be expected. The displacement step of the correction elements such that the actual variation of the actual values of the structure image sizes of object structures in the image field corresponds to the predetermined variation within the tolerance bandwidth, is an optimization task which can be achieved using corresponding optimization algorithms. When configuring the correction device of the illumination system, all imaging light partial beams are influenced differently by the correction device.

The projection exposure apparatus can have an object holder for holding the object, which object holder is displaceably driven along the displacement direction. The projection exposure apparatus can have a substrate holder for holding a substrate, which substrate holder is displaceably driven along the displacement direction. At the beginning of the adjustment method, the intensity distribution of at least one of the individual imaging light partial beams is ascertained without the correction device having an effect. To this end, the correction device can be moved before this ascertainment step into a neutral position that does not influence the imaging light partial beams.

An influence of the object structures to be imaged on the imaging light partial beams, in particular a diffractive influence, affects a simulation or calculation of the intensity distributions in the image or wafer plane. The result is a dependence of the structure image size variation on the object structure to be imaged.

In some embodiments, the structure image size ascertainment device can be in signal communication with the channel intensity distribution ascertainment device.

A UNICOM can be used as a correction device. In terms of a principle design, such a UNICOM is known from WO 2009/074 211 A1, DE 10 2008 013 229 A1 and the documents cited therein.

As an alternative to a simulation of the intensity distribution for a specific reticle structure in the image or wafer plane, it is also possible to use an AIMS. An AIMS has proven to be a suitable measuring instrument in ascertaining an intensity distribution in the image or wafer plane over the field height. In terms of a principle design, such an AIMS is known for example from DE 102 20 815 A1.

The channel intensity distribution ascertainment device can ascertain the intensity distributions of at least some of the individual imaging light partial beams in the region of an object plane, in which the object field is located, or in the region of an image plane, in which the image field is located. This ascertainment can occur by measurement and/or by simulation and/or by calculation. If the intensity distribution in the image plane is measured, the reticle can be removed or, if a reflective reticle is used, be replaced by a non-structured reticle. The intensity distribution can be measured resolved over the illumination angles using a Fourier optical unit which is arranged in the respective field plane, that is to say in the object plane or in the image plane. The channel intensity distribution ascertainment device can be used to determine an illumination of an object or reticle.

An illumination optical unit, an illumination system, a projection exposure apparatus, and a production method can exhibit advantages corresponding to those noted above. The light source of the projection exposure apparatus can be a EUV light source.

BRIEF DESCRIPTION OF THE DRAWINGS

Exemplary embodiments of the disclosure are explained in greater detail below with reference to the drawing, in which.

DETAILED DESCRIPTION

Figure 1:
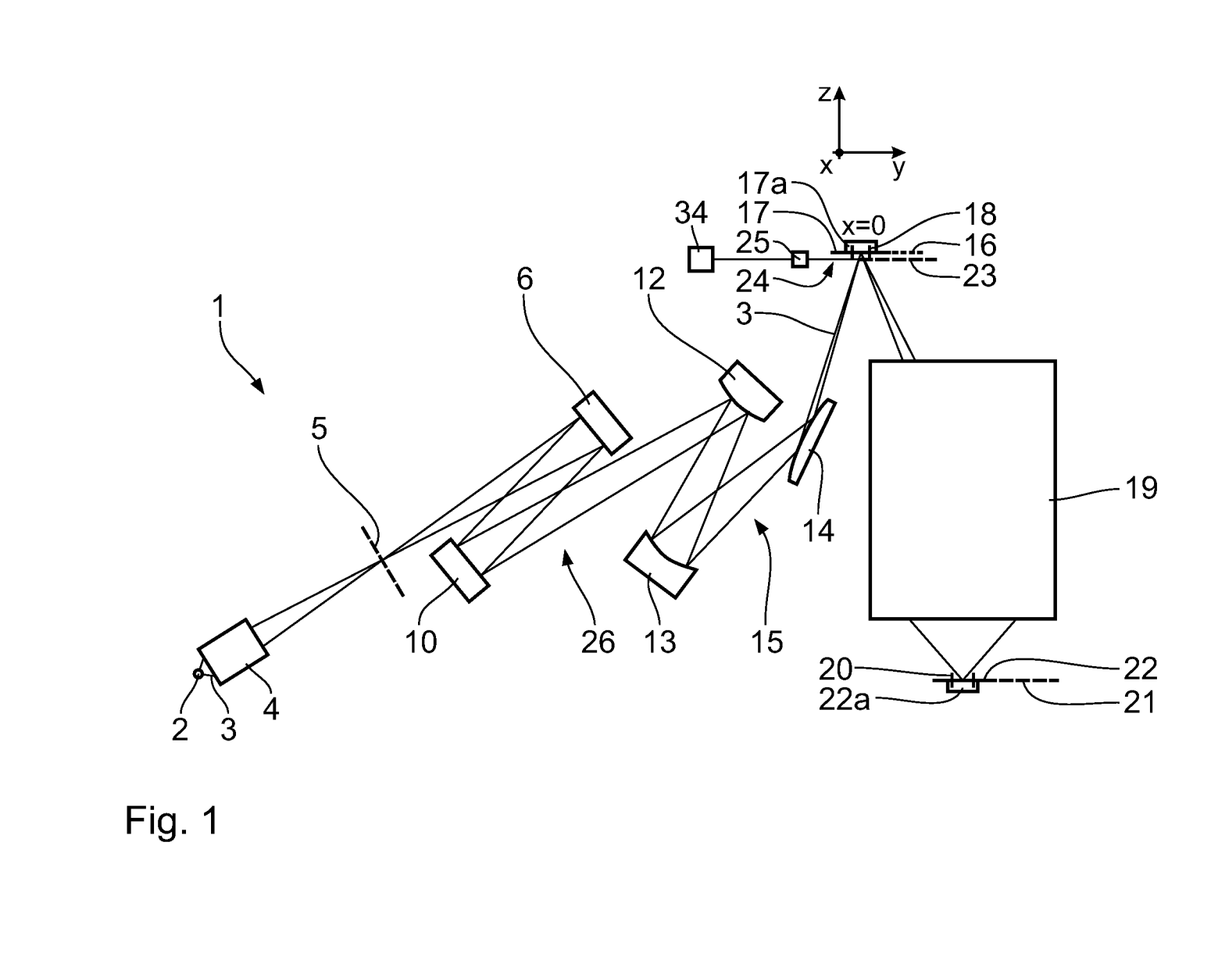
FIG. 1 shows schematically a meridional section of a projection exposure apparatus for microlithography with reference to an illumination optical unit.

A projection exposure apparatus 1 for microlithography serves for producing a micro- or nano-structured electronic semiconductor component. A light source 2 emits EUV radiation, used for illumination, in a wavelength range of for example between 5 nm and 30 nm. The light source 2 can be a GDPP source (gas discharge produced plasma) or an LPP source (laser produced plasma). A radiation source based on a synchrotron can also be used for the light source 2. Information relating to such a light source can be gathered by a person skilled in the art for example in U.S. Pat. No. 6,859,515 B2. For illumination and imaging within the projection exposure apparatus 1, EUV illumination light or illumination radiation in the form of an imaging light beam 3 is used. The imaging light beam 3 passes, downstream of the light source 2, first through a collector 4, which may be for example a nested collector with a multi-shell construction known from the prior art or alternatively a collector of ellipsoidal shape, then arranged downstream of the light source 2. A corresponding collector is known from EP 1 225 481 A. Downstream of the collector 4, the EUV illumination light 3 first passes through an intermediate focal plane 5, which can be used for separating the imaging light beam 3 from undesired radiation or particle components. After passing through the intermediate focal plane 5, the imaging light beam 3 first impinges on a field facet mirror 6.

To simplify the description of positional relationships, in each case a Cartesian global xyz coordinate system is plotted in the drawing. The x axis extends in FIG. 1 perpendicular to the drawing plane and out of the latter. The y axis extends in FIG. 1 to the right. The z axis extends in FIG. 1 upwards.

To simplify the description of positional relationships in individual optical components of the projection exposure apparatus 1, in the subsequent figures in each case a Cartesian local xyz or xy coordinate system is also used. The respective local xy coordinates define, unless otherwise described, a respective main arrangement plane of the optical component, for example a reflection plane. The x axes of the global xyz coordinate system and of the local xyz or xy coordinate systems extend mutually parallel. The respective y axes of the local xyz or xy coordinate systems have an angle with respect to the y axis of the global xyz coordinate system which corresponds to an inclination angle of the respective optical component about the x axis.

Figure 4:
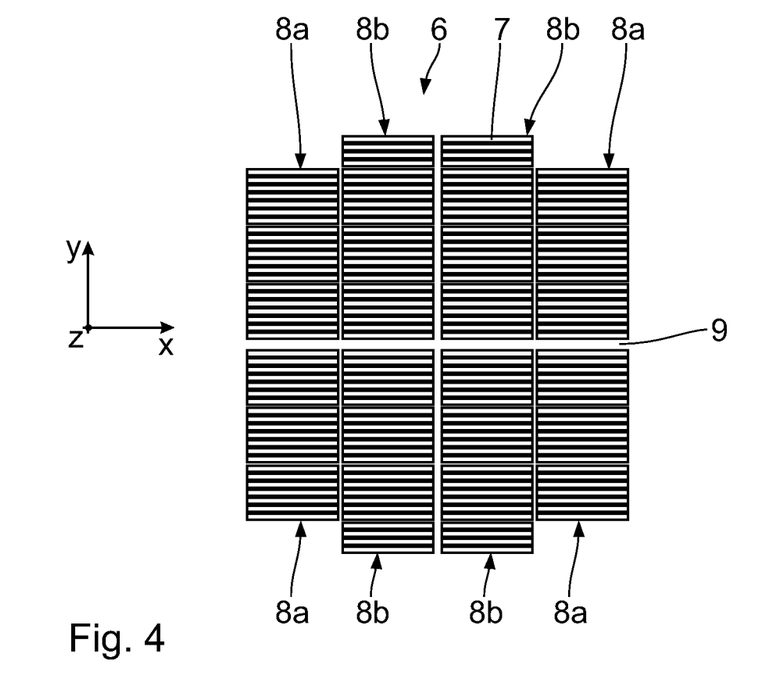
FIG. 4 shows a view of a facet arrangement of a field facet mirror of the illumination optical unit of the projection exposure apparatus according to FIG. 1.

FIG. 4 shows by way of example a facet arrangement of field facets 7 of the field facet mirror 6. The field facets 7 are rectangular and have in each case the same x/y aspect ratio. The x/y aspect ratio can be for example 12/5, 25/4 or 104/8.

The field facets 7 provide a reflection surface of the field facet mirror 6 and are grouped into four columns of in each case six to eight field facet groups 8a, 8b. The field facet groups 8a have in each case seven field facets 7. The two additional edge-side field facet groups 8b of the two central field facet columns have in each case four field facets 7. Between the two central facet columns and between the third and fourth facet rows, the facet arrangement of the field facet mirror 6 has intermediate spaces 9, in which the field facet mirror 6 is shaded by holding spokes of the collector 4. If an LPP source is used as the light source 2, a corresponding shading can also result from a tin droplet generator which is arranged adjacent to the collector 4 and is not illustrated in the drawing.

After reflection on the field facet mirror 6, the imaging light beam 3, which is split into imaging light partial beams, which are assigned to the individual field facets 7, impinges on a pupil facet mirror 10. The respective imaging light partial beam of the total imaging light beam 3 is guided along in each case one imaging light channel.

Figure 5:
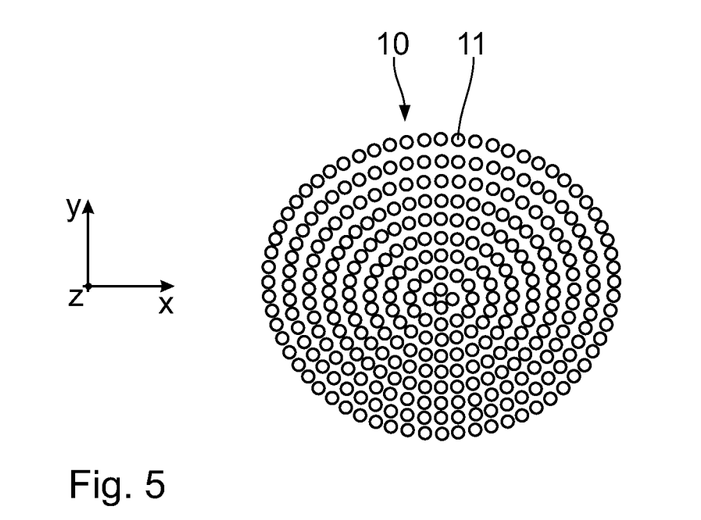
FIG. 5 shows a view of a facet arrangement of a pupil facet mirror of the illumination optical unit of the projection exposure apparatus according to FIG. 1.

FIG. 5 shows an exemplary facet arrangement of round pupil facets 11 of the pupil facet mirror 10. The pupil facets 11 are arranged around a center in facet rings which are located one inside the other. Assigned to each imaging light partial beam of the EUV illumination light 3, which are reflected by one of the field facets 7, is a pupil facet 11, such that in each case one impinged-upon facet pair with one of the field facets 7 and one of the pupil facets 11 provides the imaging light channel for the associated imaging light partial beam of the EUV illumination light 3. The channel-wise assignment of the pupil facets 11 to the field facets 7 is carried out in dependence on a desired illumination by the projection exposure apparatus 1.

The field facets 7 are imaged into an object plane 16 of the projection exposure apparatus 1 via the pupil facet mirror 10 (FIG. 1) and a subsequent transfer optical unit 15, which includes three EUV mirrors 12, 13, 14. The EUV mirror 14 is configured as a mirror for grazing incidence. Arranged in the object plane 16 is a reticle 17, from which an illumination region is illuminated with the EUV illumination light 3, which illumination region coincides with an object field 18 of a downstream projection optical unit 19 of the projection exposure apparatus 1. The imaging light channels are superposed in the object field 18. The EUV illumination light 3 is reflected by the reticle 17. The reticle 17 is held by an object holder 17a, which is displaceable driven along the displacement direction y.

The projection optical unit 19 images the object field 18 in the object plane 16 into an image field 20 in an image plane 21. Arranged in this image plane 21 is a wafer 22 which carries a light-sensitive layer, which is exposed using the projection exposure apparatus 1 during the projection exposure. The wafer 22, that is to say the substrate, on which it is imaged, is held by a substrate holder 22a, which is displaceable along the displacement direction y synchronously to the displacement of the object holder 17a. During the projection exposure, both the reticle 17 and the wafer 22 are scanned in a synchronized manner in the y direction. The projection exposure apparatus 1 is configured as a scanner. The scanning direction will be referred to below also as the object displacement direction.

Arranged in a correction plane 23 is a field intensity correction device 24, which will be explained in more detail below. The correction device 24, also referred to as UNI-COM, serves for adjusting a scan-integrated intensity distribution, that is to say integrated in the y direction, over the object field 18. The correction device 24 is controlled by a control device 25. Examples of a field correction device are known from WO 2009/074 211 A1, EP 0 952 491 A2 and DE 10 2008 013 229 A1.

The field facet mirror 6, the pupil facet mirror 10, the mirrors 12 to 14 of the transfer optical unit 15 and the correction device 24 are components of an illumination optical unit 26 of the projection exposure apparatus 1. Together with the projection optical unit 19, the illumination optical unit 26 forms an illumination system of the projection exposure apparatus 1.

Figure 2:
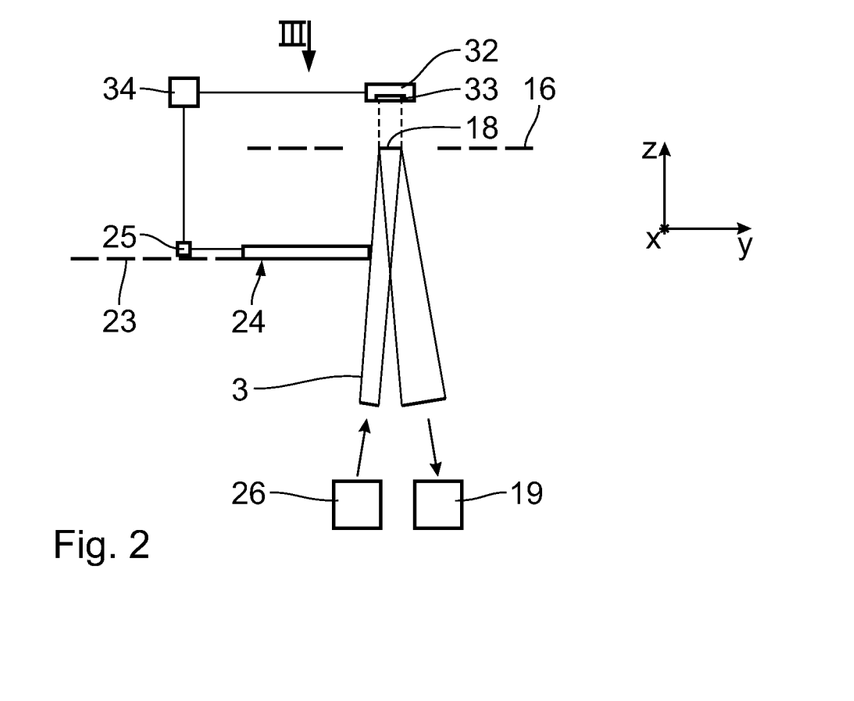
FIG. 2 shows an excerpt enlargement from FIG. 1 in the region of a reticle or object plane.
Figure 3:
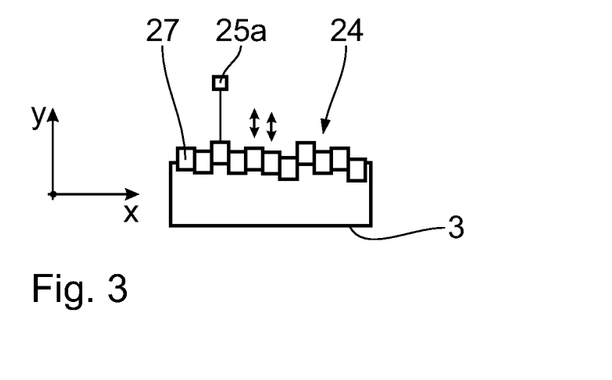
FIG. 3 shows a view of a correction device of the projection exposure apparatus from the viewing direction III in FIG. 2.

FIGS. 2 and 3 show the correction device 24 more clearly in detail. The correction device 24 has a plurality of adjacently arranged, finger-type individual diaphragms 27. In the embodiment according to FIGS. 2 and 3, for example twenty-six individual diaphragms 27 with a respective width of 4 mm can be present. These individual diaphragms 27 are directly adjacent to one another or also partially overlapping. In the case of a partial overlapping, adjacent ones of the individual diaphragms 27 are be located in planes, which are as closely adjacent to one another as possible, perpendicular to the beam direction of the EUV illumination light 3.

In FIG. 3, a displacement actuator 25a for one of the individual diaphragms 27 is illustrated in representative fashion, which displacement actuator is controlled by the control device for the specification of the respective y position of this individual diaphragm 27. In fact, such a displacement actuator 25a is assigned to each of the individual diaphragms 27.

All individual diaphragms 27 are inserted into the EUV illumination light 3 from the same side.

Using the control device 25, the individual diaphragms 27 can be adjusted into a predetermined position independently of one another in the y direction. Depending on the field height in which an object point on the reticle 17 passes the object field 18, that is to say in which x position, the scanning path of this object point in the y direction and thus the integrated intensity, which this object point is subjected to, of the imaging light partial beams of the total imaging light beam 3, which are superposed in this x position is determined from the y position of the respective individual diaphragm 27. In this way by specifying the y positions of the individual diaphragms 27 it is possible to achieve a specified distribution of the intensity of the imaging light partial beam 3 illuminating the reticle 17.

Figure 6:
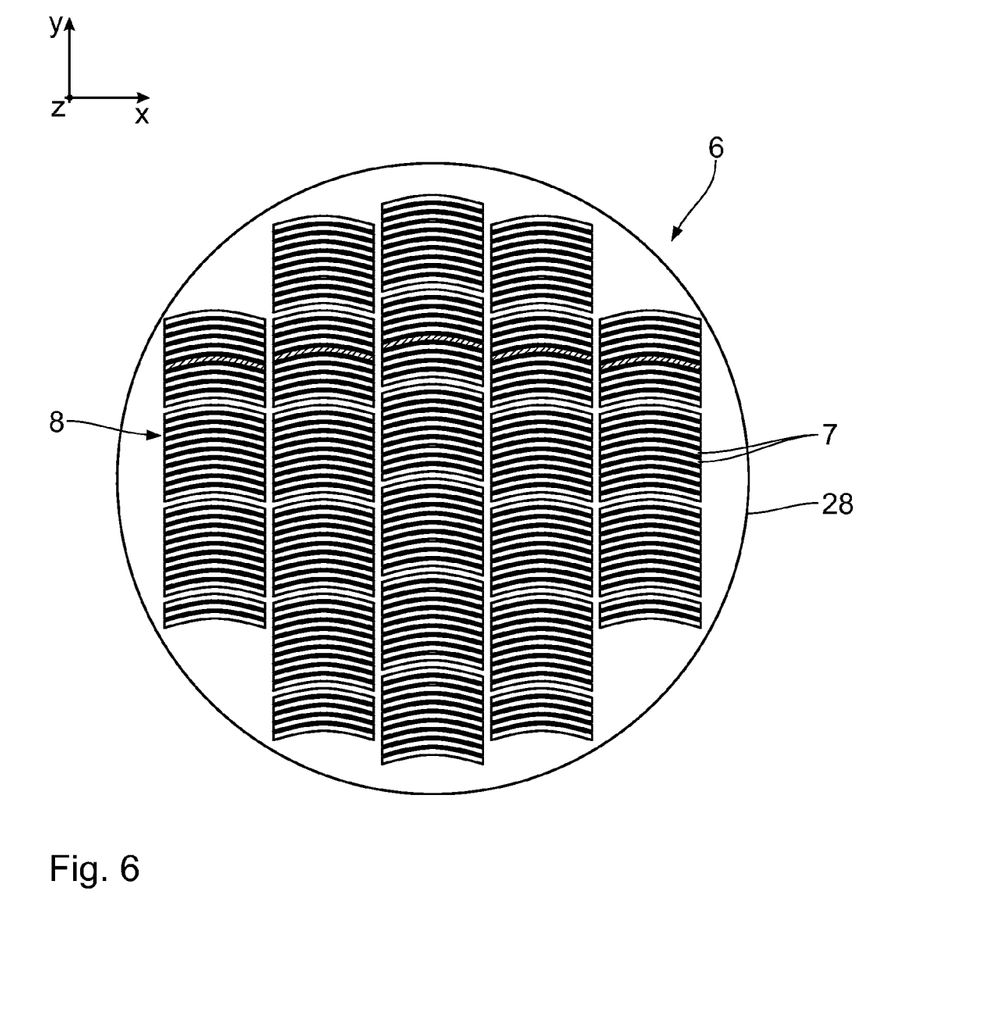
FIG. 6 shows a facet arrangement of a further embodiment of a field facet mirror in an illustration similar to FIG. 4.

FIG. 6 shows a further embodiment of a field facet mirror 6. Components corresponding to those which were explained above with reference to the field facet mirror 6 according to FIG. 4 have identical reference signs and will now be explained to the extent that they differ from the components of the field facet mirror 6 according to FIG. 4. The field facet mirror 6 according to FIG. 6 has a field facet arrangement with bent field facets 7. These field facets 7 are arranged in a total of five columns with in each case a plurality of field facet groups 8. The field facet arrangement is set in a circular boundary of a carrier plate 28 of the field facet mirror.

The field facets 7 of the embodiment according to FIG. 6 all have the same surface area and the same ratio of width in the x direction to height in the y direction which corresponds to the x/y aspect ratio of the field facets 7 of the embodiment according to FIG. 4.

Figure 7:
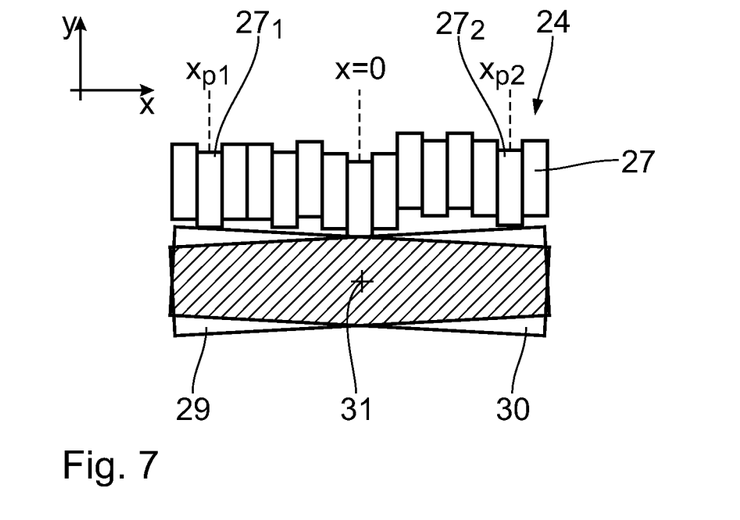
FIG. 7 shows the correction device and two imaging light partial beams, which are assigned to two different imaging light channels of a total imaging light beam, in a view similar to FIG. 3.

FIG. 7 shows, in an illustration similar to FIG. 3, the correction device 24 again schematically in a plan view, wherein the viewing direction of the viewer is along the z direction. FIG. 7 shows the correction device 24 with a larger number of individual diaphragms 27 than FIG. 3 and in addition the individual diaphragms 27 with an x/y aspect ratio that is smaller in the plan view.

Figure 8:
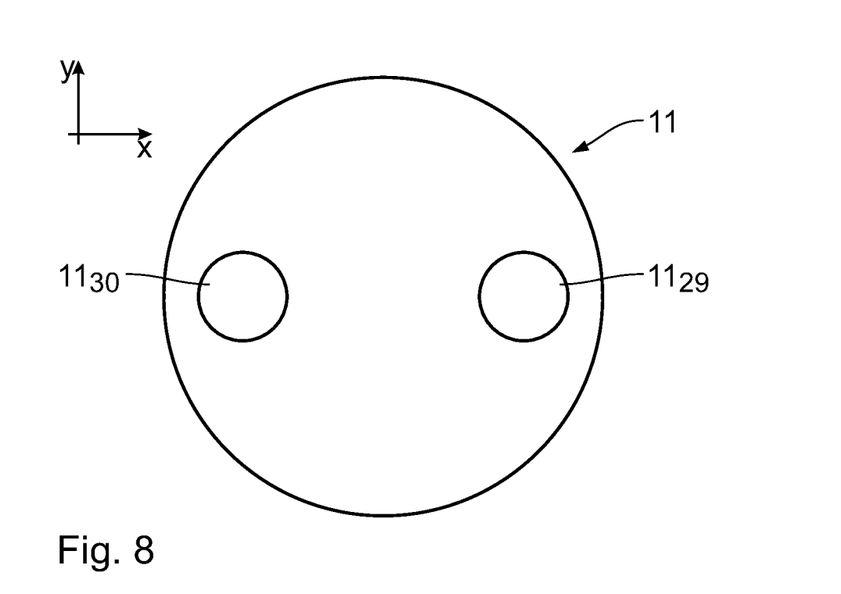
FIG. 8 shows, highly schematically and emphasized, those two facets of the facet arrangement of the pupil facet mirror according to FIG. 5 which are assigned to the two imaging light partial beams illustrated in FIG. 7.

Shown in FIG. 7 is not the cross section of the total imaging light beam 3, which cross section is superposed in the correction plane 23, but shown are two selected imaging light partial beams 29, 30. The other imaging light partial beams of the total imaging light beam 3 are omitted in FIG. 7. The imaging light partial beam 29 is guided along an imaging light channel, which is associated with a pupil facet $11_{29}$, which is illustrated schematically in FIG. 8. The other imaging light partial beam 30 shown in FIG. 7 is guided along an imaging light channel, which is associated with another pupil facet $11_{30}$, which is likewise illustrated schematically in FIG. 8. The two pupil facets $11_{29}$, $11_{30}$ provide two illumination directions for the object field 18, the directional contributions of which in the x-dimension have the same absolute values but the opposite sign. The beam guidance of the two imaging light channels, which are assigned to the two pupil facets $11_{29}$, $11_{30}$, over the field facet mirror 7, the pupil facet mirror 11 and the transfer optical unit 15 results in a tilting of the cross sections of the imaging light partial beams 29, 30 about the z axis. This tilting is illustrated in FIG. 7. Relative to the cross section of the imaging light partial beam 29, the cross section of the imaging light partial beam 30 is tilted clockwise by a few angular degrees about a centric tilting axis 31, which extends in the z direction. This results in the imaging light partial beam 30 in the y direction for negative x values being closer to the correction device 24 than the imaging light partial beam 29. For positive x values, conversely, the imaging light partial beam 29 in the y direction is located closer to the correction device 24 than the imaging light partial beam 30. This results in an illumination-direction-dependent shading effect of the individual diaphragms 27, as will be explained below additionally with reference to FIGS. 9 and 10 with reference to two selected individual diaphragms $27_1$, $27_2$ of the individual diaphragm 27 of the correction device 24. The individual diaphragm $27_1$ is arranged (cf. FIG. 7) in the region of the field height $x_{p1}$. The individual diaphragm $27_2$ is arranged in the region of the field height $x_{p2}$.

Figure 9:
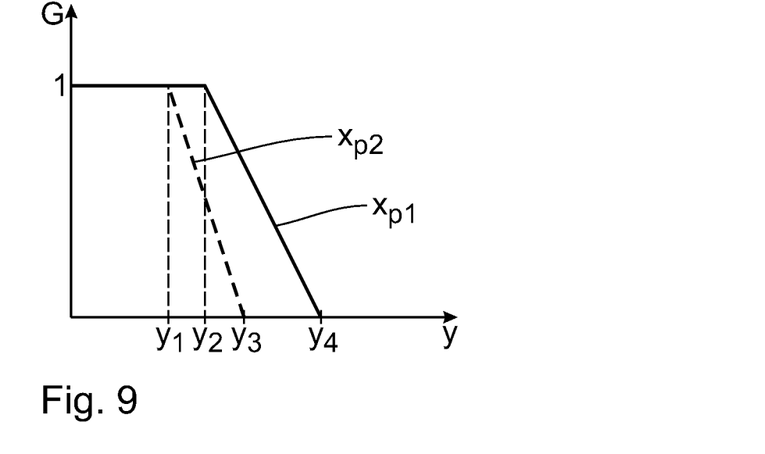
FIG. 9 shows, in a diagram, the dependence of an attenuation G for one of the two imaging light partial beams, illustrated in FIG. 7, by in each case one of the individual diaphragms of the correction device as a function of the individual diaphragm displacement position, illustrated (solid/dashed) for two of the individual diaphragms, which are arranged at different transverse coordinates transverse to a displacement direction of a displacement of an object to be imaged during the projection exposure.

FIG. 9 shows shading or attenuation G of the imaging light partial beam 29 by the two individual diaphragms $27_1$, $27_2$ in dependence on a y position of a leading shading edge of these individual diaphragms $27_1$, $27_2$. The shading through the individual diaphragm $27_1$ (field height $x_{p1}$) is shown in a solid line. The shading through the individual diaphragm $27_2$ (field height $x_{p2}$) is shown in dashed lines. Since in the region of the field height $x_{p2}$ the imaging light partial beam 29 is located closer to the correction device 24 than in the region of the field height $x_{p1}$, for a given x position of the leading shading edge of the individual diaphragms $27_1$, $27_2$, first the imaging light partial beam 29 at the field height $x_{p2}$ is shaded. This shading begins at a y position $y_1$ (cf. FIG. 9) of the individual diaphragm $27_2$. The individual diaphragm $27_1$, so that it shades the imaging light partial beam 29, is moved further, to be precise to the y position $y_2$. If the individual diaphragm $27_2$ is moved even further, specifically to the y position $y_3$, the individual diaphragm $27_2$ completely shades (G=0) the imaging light partial beam 29 in the region of the field height $x_{p2}$. Between the y positions $y_1$ and $y_3$ the shading of the imaging light partial beam 29 through the individual diaphragm $27_2$ runs linear. The individual diaphragm $27_1$, for complete shading of the imaging light partial beam 29, is moved even further, specifically to the y position $y_4$. Between the y positions $y_2$ and $y_4$ the shading of the imaging light partial beam 29 through the individual diaphragm $27_1$ takes place linearly.

Figure 10:
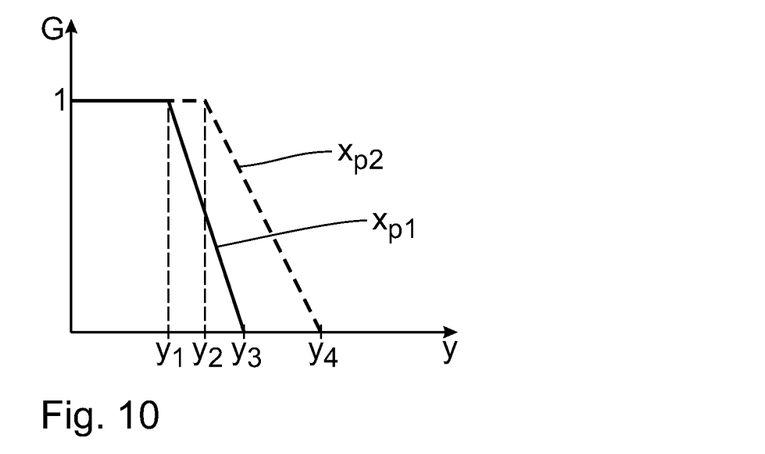
FIG. 10 shows, in a diagram illustration corresponding to FIG. 9, the dependence of the attenuation G for the other imaging light partial beams, illustrated in FIG. 7, by the two individual diaphragms, again as a function of the individual diaphragm displacement position.

FIG. 10 illustrates the shading ratios for the imaging light partial beam 30. These shading ratios are, with respect to the two individual diaphragms $27_1$, $27_2$ exactly the inverse of the shading ratios for the imaging light partial beam 29. The first shading of the imaging light beam 30 takes place in the y position $y_1$ of the individual diaphragm $27_1$. The individual diaphragm $27_2$ is moved out up to the y position $y_2$ for it to shade the imaging light partial beam 30. In the y position $y_3$, the individual diaphragm $27_1$ completely shades the imaging light partial beam 30. The individual diaphragm $27_2$ is moved out further, specifically to the y position $y_4$, for it to completely shade the imaging light partial beam 30.

The two shading curves for the individual diaphragms $27_1$, $27_2$, which are illustrated in FIGS. 9 and 10, have different gradients. The reason for this is that the imaging light partial beams of the imaging light beam 3 typically do not have exactly the same width in the y direction for all field heights, which is not shown in the idealized illustration of the imaging light partial beams 29, 30 in FIG. 7. The smaller a y extent of one of the imaging light partial beams for a specific field height $x_p$, the greater the gradient of the shading curve of the individual diaphragm 27 which is effective at this field height $x_p$. In the example illustrated in FIGS. 9 and 10, it is presumed that the imaging light partial beam 29 in the region of the field height $x_{p2}$ has a smaller y extent than in the region of the field height $x_{p1}$. Conversely, it is assumed for the shading ratios according to FIG. 10 that the imaging light partial beam 30 at the field height $x_{p1}$ has a smaller y extent than in the region of the field height $x_{p2}$.

It emerges from these different shading effects of the individual diaphragms $27_1$, $27_2$ for the imaging light partial beams 29, 30 that the individual diaphragms $27_1$, $27_2$ act in an illumination-direction-dependent manner. The individual diaphragm $27_1$ can be moved out, for example, so far that it partially shades the imaging light partial beam 30 but not the imaging light partial beam 29. Conversely, the individual diaphragm $27_2$ can be moved out so far that it shades the imaging light partial beam 29, but not the imaging light partial beam 30.

A distribution of an intensity of an imaging light partial beam over the field height x in dependence on the respective y positions of the individual diaphragms 27 of the correction device 24, arranged at location $x_p$, can be formulated in an abstract form as $$I_{imaginglightbeam,total}(x_p, \vec{u}) = \qquad (1)$$
$$\sum_{i=1}^{N} I^{(i)}_{imaginglightpartialbeam}(x_p) \cdot G^{(i)}_{UNICOM}(x_p, \vec{u})$$

An intensity distribution $I_{imaginglightbeam,total}$ of the total imaging light beam 3 over the field height x results in dependence on the y positionings of the individual diaphragms 27 as superposition of all intensity distributions of the imaging light partial beams over the field height x. The field height coordinate x can relate in this case to the object field 18 or to the image field 20, depending on whether the intensity distribution of the imaging light beam 3 in the object plane 16 or in the image plane 21 is specified.

In the above equation, $\vec{u}$ is a vector, which indicates the y positions of all the individual diaphragms 27 at the respective location $x_p$. x is the field height, that is to say the transverse coordinate transverse to the displacement direction y of the reticle 17 and of the wafer 22.

A sum is formed in this case over all the imaging light channels 1 to N, with N being the number of used facets of the field facet mirror 6 or of the pupil facet mirror 10. $I_{imaginglightpartialbeam}$ represents here the field dependence of the intensity of each imaging light partial beam without attenuation by the correction device 24. $G^{(i)}$ represents the relative attenuation of the respective imaging light partial beam by the correction device 24 in the specified y position of all individual diaphragms 27, which is characterized by the vector $\vec{u}$.

In concrete terms, two cases are differentiated. In the first case, when adjusting the illumination system 26, the imaging light partial beams are considered without taking into account the effects of the object structures. In this case, the following specifically applies:

$$I'_{imaginglightbeam,total}(x_p, \vec{u}) = \qquad (2)$$
$$\sum_{i=1}^{N} I'^{(i)}_{imaginglightpartialbeam}(x_p) \cdot G^{(i)}_{UNICOM}(x_p, \vec{u})$$

wherein the calculated or measured intensity distributions of the total imaging light beam and of the imaging light partial beams are denoted I'. In this case, the total imaging light beam and the imaging light partial beams at the location of the object field 18 or at the location of the image field 20 can be ascertained. When ascertaining at the location of the image field 20 is carried out, care is taken that the effects of the object structures do not undesirably falsify the ascertainment result. When measuring, for example the reticle 17 can be removed or, if a reflective reticle 17 is used, can be replaced by a non-structured reticle 17. Corresponding measures should be taken in the event of a calculation.

In the second case, the imaging light partial beams are considered inclusive of the effects of the object structures. In this case, the following applies:

$$I''_{imaginglightbeam,total}(x_p, \vec{u}) = \qquad (3)$$
$$\sum_{i=1}^{N} I''^{(i)}_{imaginglightpartialbeam}(x_p) \cdot G^{(i)}_{UNICOM}(x_p, \vec{u})$$

wherein the calculated or measured intensity distributions of the total imaging light beam and of the imaging light partial beams are denoted I''. In this case, especially diffraction influences of the object structures to be imaged on the imaging light partial beams are taken into account. The intensity distribution of the total imaging light beam in the image field 20, that is to say the imaging of a specific object structure or mask structure in the image plane 21, which is calculated or measured in this context is also referred to as an aerial image. The intensity distribution of each individual imaging light partial beam in the image field 20 is accordingly referred to as a partial aerial image.

In the first case, without considering the effects of the object structures, a relatively uniform intensity distribution $I'_{imaginglightbeam,total}(x_p, \vec{u})$ as a function of the field height is obtained. In the second case, the intensity distribution $I''_{imaginglightbeam,total}(x_p, \vec{u})$ of the total imaging light beam is highly structured, since it represents an image of the object structure. However, not all intensity distributions of the imaging light partial beams $I''(i)_{imaginglightpartialbeam}(x_p)$ (partial aerial images) are structured in the same way because according to Abbe's theory of imaging not all imaging light partial beams contribute equally well to the formation of an image. In particular, some imaging partial beams $I''_{imaginglightpartialbeam}{}^{(background)}(x_p)$ make no contribution to image formation, since they impinge on the object structure from a direction such that diffracted radiation of these imaging light partial beams cannot pass through the projection optical unit 19. Only the non-diffracted component of these background partial beams, i.e. a zero-th order of diffraction, impinges on the image plane. Therefore, no interference pattern in the intensity distribution $I''_{imaginglightpartialbeam}{}^{(background)}(x_p)$ of this imaging light partial beam is obtained. The background partial beams thus only contribute to a background intensity. For other imaging light partial beams, an interference of two or more rays at the location of the image field is obtained. According to Abbe's theory of imaging, the interference pattern of these imaging light partial beams corresponds to the image of the object structure. For further details with respect to Abbe's theory of imaging, reference is made to "Handbook of optical systems: Vol. 2, Physical image formation, chapter 2.1, the Abbe theory of imaging", Wiley VCH 2005.

For the adjustment method for the illumination system with the illumination optical unit 26 and the projection optical unit 19, the intensity distribution of the total imaging light beam 3 $I''_{imaginglightpartialbeam,total}(x_p, \vec{u})$ inclusive of the effects of the object structures is a relevant variable for the correct development of a light-sensitive layer on the wafer 22.

For optimum imaging, it is not absolutely necessary for the intensity of the total imaging light beam over the field height to be uniform. The relevant variable is rather the intensity distribution in the image plane 21 taking into consideration the effects of the object structures. To specify an adjustment of the individual diaphragms 27 of the correction device 24, the equation (3) is used within the context of the adjustment method of the illumination system. The vector $\vec{u}$, that is to say the individual y positions of all the individual diaphragms 27, is defined such that an actual variation (ΔCD) of structure image sizes (CD) of object structures, which variation can be determined on the basis of the intensity distribution $I''_{imaginglightpartialbeam,total}(x_p, \vec{u})$ matches a predetermined variation within a tolerance bandwidth.

In order to carry out the adjustment method for the illumination system of the illumination exposure apparatus 1, the latter has a channel intensity distribution ascertainment device 32. The channel intensity distribution ascertainment device 32 serves for ascertaining an illumination of the reticle 17, that is to say an intensity distribution over the object field 18. This intensity distribution can then be used, while taking into account also the effect of the correction device 24, that is to say while taking into account the function G in the above equation (1), to ascertain the aerial image in the image field 20 for a specific reticle structure. It is possible with the channel intensity distribution ascertainment device 32 to ascertain, with the reticle removed, intensity distributions of at least some of the individual imaging light partial beams, that is to say for example of the imaging light partial beams 29, 30 along the field height, that is to say along the transverse coordinate x, for a given arrangement of imaging light channels in the illumination optical unit 26, that is to say for a given assignment of the field facets 7 to the pupil facets 11, by way of measurement. The channel intensity distribution ascertainment device 32 (cf. FIG. 2) has a CCD chip 33, onto which the object field 18 is imaged. The CCD chip 33 has in the x direction a spatial resolution which is matched to the x extent of the individual diaphragms 27 of the correction device 24. Depending on the embodiment of the channel intensity distribution ascertainment device 32, the latter can alternatively or additionally measure an intensity and/or illumination angle distribution in the object plane 16, as illustrated in FIG. 2, or in the image plane 21.

Alternatively to the use of the channel intensity distribution ascertainment device 32, it is also possible for the information to be ascertained by way of simulations using geometrical data of the illumination optical unit 26.

A structure image size variation ascertainment device 34 is in signal communication with the channel intensity distribution ascertainment device 32. The structure image size variation ascertainment device 34 in turn is in signal communication with the control device 25 for the correction device 24. The structure image size variation ascertainment device 34 serves for ascertaining an actual variation ΔCD of actual values of structure image sizes CD of object structures, that is to say of structures on the reticle 17, in the image field 20. These variations are produced by superposition of the imaging light partial beams of the imaging light beam 3 in the image field 20. The structure image size variation ascertainment device 34 ascertains the variation ΔCD in dependence on the field height, that is to say in dependence on the transverse coordinate x. In addition, the structure image size variation ascertainment device 34 can ascertain the actual variation ΔCD in dependence on the structure size. In principle, signal communication between the channel intensity distribution ascertainment device 32 and the structure image size variation ascertainment device 34 is not absolutely necessary. It suffices for the structure image size variation ascertainment device 34 to take into account the function G according to the above equation (1).

Inside the structure image size variation ascertainment device 34, a simulation program for calculating a reticle image in semiconductor lithography projection optical units can be used, which simulation program is known in principle from the prior art. Programs for modeling an image of specified object structures in dependence on the specification of the illumination are, for example, the program Prolith™ from KLA-Tencor, CA, USA, and the program Sentaurus Lithography™ from Synopsys CA, USA. The ascertainment of the actual variation ΔCD takes into account the imaging properties of the illumination optical unit 26, the properties of the light source 2, the influence of the object structures to be imaged of the reticle 17 and imaging properties of the projection optical unit 19. The function G, indicated above in connection with the equation (1), can be determined by way of a measurement, but alternatively also on the basis of manufacturer-specific shading data. It is possible with the structure image size variation ascertainment device 34 to determine those u vectors, that is to say those relative positions of all the individual diaphragms 27 of the field intensity correction device 24, which lead to the desired predetermined variation of the structure image size.

The adjustment method for the illumination system of the projection exposure apparatus 1 is explained below with reference to the schematic FIG. 13.

In a preparation step 35, the correction device 24 is first moved into a neutral position, in which the correction device does not influence the imaging light partial beams of the total imaging light partial beam 3. By way of example such a position for the imaging light partial beams 29, 30 is illustrated in FIG. 7.

In an ascertainment step 36, when the reticle is removed and the channel intensity distribution ascertainment device 32 is brought into position, intensity distributions of at least some of the individual imaging light beams along the transverse coordinate x are ascertained for a given arrangement of imaging light channels in the illumination optical unit 26.

In a further ascertainment step 37, an actual variation ΔCD of actual values of structure image sizes CD of object structures of the reticle 17 in the image field 20, which are produced by superposition of the imaging light partial beams, measured in the ascertainment step 36, in the image field 20, is ascertained in dependence on the transverse coordinate x. To this end the image of the structure of the reticle 17 in the image plane 21 is calculated using the simulation program with knowledge of the illumination intensity distribution at the reticle 17 and from this the structure image size variation is determined. Alternatively the structure image size variation can be measured by measuring with an Aerial Image Metrology System (AIMS), which is known for example from DE 102 20 815 A1. Alternatively or additionally, in the ascertainment step 37 a test reticle with corresponding structure image sizes can be used. The ascertainment of the structure image size variation in ascertainment step 37 includes the result of the intensity distribution ascertainment in ascertainment step 36.

In a specification step 38, a predetermined variation of the structure image sizes over the transverse coordinate x is specified. This specification can occur on the basis of the structure sizes to be imaged in the context of an exposure to be carried out.

On the basis of the specified predetermined variation of the structure image sizes and of the ascertained actual variation of the structure image sizes, the structure image size variation ascertainment device 34 calculates a distribution of y displacement positions of the various individual diaphragms 27 of the correction device 24. In a displacement step 39, the individual diaphragms 27 of the correction device 24 are then moved, starting from the neutral position, into individual y positions such that the actual variation of the structure image size matches the predetermined variation within a tolerance bandwidth.

To this end, the structure image size variation ascertainment device 34 transmits the calculated y position values for the various individual diaphragms 27 to the control device 25.

The individual diaphragms 27 represent correction elements of the correction device 24.

Figure 11:
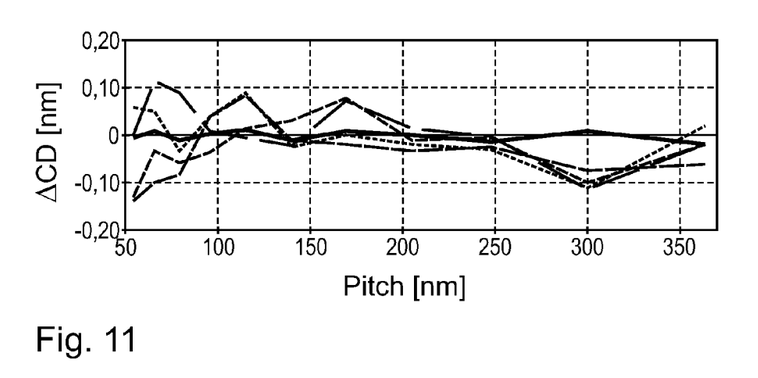
FIG. 11 shows, in a diagram, a dependence of a variation of a critical dimension ($\Delta CD$) on a line width of a reference line structure of an object to be imaged with the projection exposure apparatus for different field transverse coordinates (field heights) after carrying out an adjustment method.

FIG. 11 shows a distribution of an actual variation of actual values of structure image sizes, ΔCD, for various sizes of object structures in the image field 20. Illustrated is the actual structure image size variation ΔCD in dependence on a line distance to be imaged, that is to say in dependence on a periodicity (pitch) to be imaged of the object structures. The structure image variation ΔCD is plotted for five different field heights, that is to say for different x positions, uniformly distributed between the two field edges in −x and +x direction. The profiles for the five field heights are illustrated in FIG. 11 by various dashed curves. In a good approximation, the structure image size variation ΔCD equals zero, independently of the field height x and independently of the periodicity in a range between 54 nm and 350 nm and with a constant line width of 27 nm. A specific line width, which can be less than 30 nm, can be imaged, owing to this practically disappearing structure image size variation ΔCD, that is to say independently of the distance of the lines to be imaged from one another and independently of the field height, with the same quality. This ensures that independently of the line distance and of the field height the lines for the light-sensitive layer can be imaged on the wafer 22 such that they can be developed well and thus ensures optimized resolution capability of the projection exposure apparatus 1.

Figure 12:
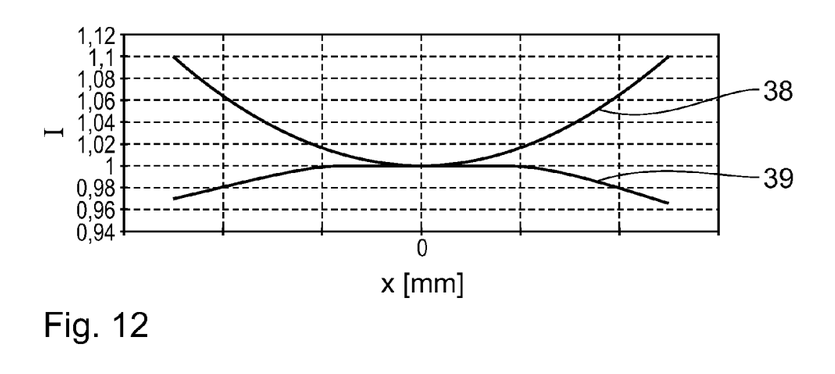
FIG. 12 shows a dependence of an intensity of the total imaging light beam over the field transverse coordinate before and after carrying out the adjustment method.
Figure 13:
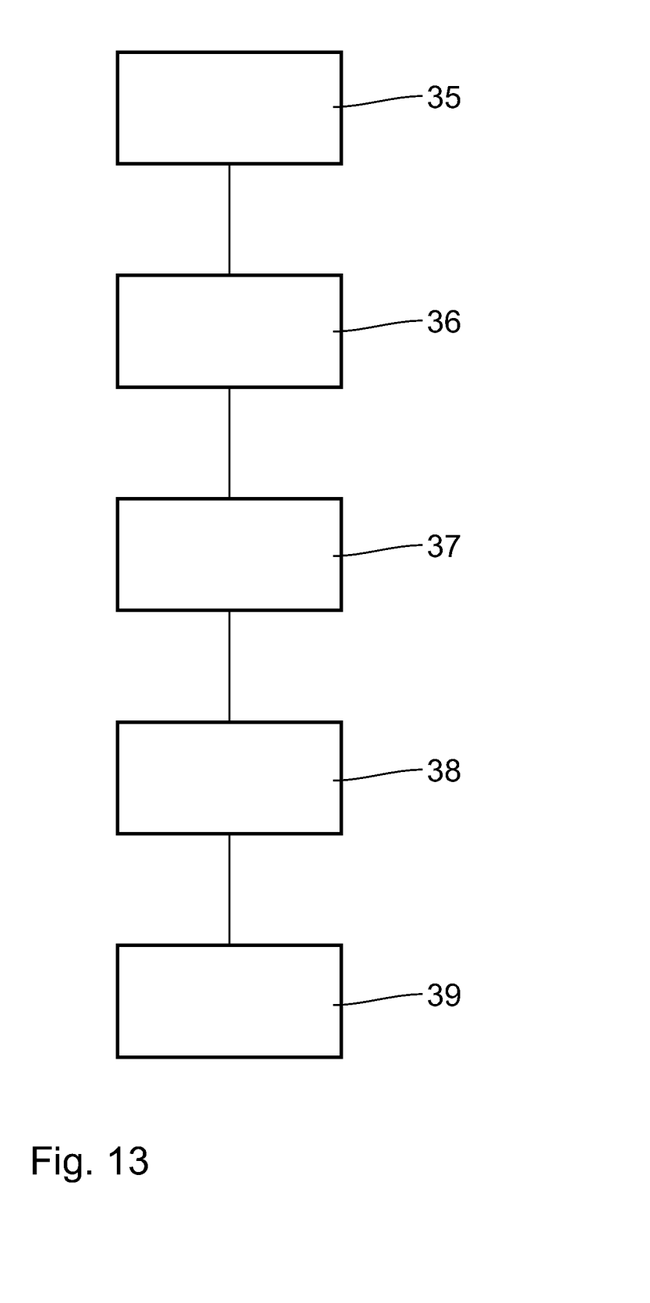
FIG. 13 shows schematically method steps of a process of the adjustment method.

FIG. 12 shows a dependence of an intensity I, which is normalized to 1, of the total imaging light beam over the field height, that is to say the field transverse coordinate x before and after carrying out the adjustment method with the steps according to FIG. 13. An intensity distribution curve 38 shows the intensity distribution over the field height before the adjustment method. An intensity distribution curve 39 shows the intensity distribution over the field height x after the adjustment method, that is to say after the method steps 35 to 39 according to FIG. 13 have been carried out. In the case of this intensity distribution with curve 39, the structure image size variation according to FIG. 11 is obtained. It can be seen clearly that after the adjustment method the intensity distribution over the field height is not homogeneous but that the intensity I drops to a value of about 0.97 towards the field edges. The intensity at the field edges is thus 3% less than the intensity at the field height x=0. Nevertheless over all field heights a practically negligible structure image size variation results. This result shows that the optimization in the adjustment method according to FIG. 13 does not optimize to a homogeneous intensity distribution but selects as the variable to be optimized that which is appropriate for the projection exposure, specifically the variation of a structure image size.

Figure 14:
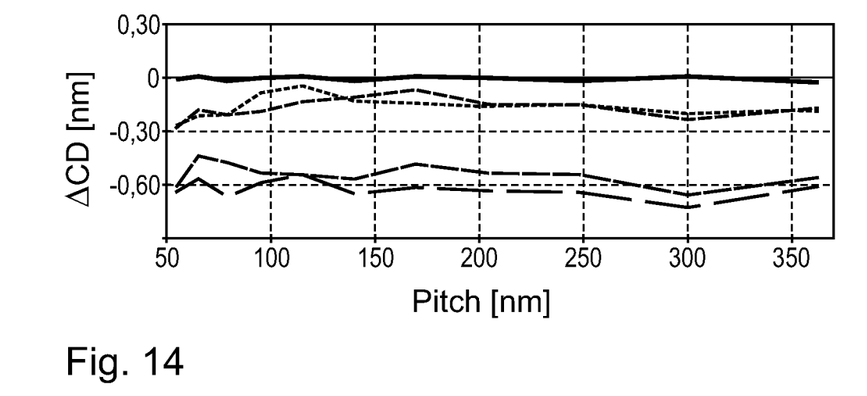
FIG. 14 shows, in a diagram illustration similar to FIG. 1, a dependence of a variation of a critical dimension ($\Delta CD$) on a line width of a reference line structure of an object to be imaged with the projection exposure apparatus for different field transverse coordinates without carrying out the adjustment method after adjustment of the correction device such that an intensity distribution arises, which is homogeneous over the field.

Conversely, an optimization to a homogeneous, that is to say uniform, intensity distribution over the object field would not necessarily lead to the desired field-height-independent constant structure imaging. The correction device 24 can in principle also be adjusted such that a homogeneous intensity distribution is obtained. FIG. 14 shows in an illustration which is analogous to FIG. 11 the distribution of an actual variation ΔCD of actual values and structure image sizes for this case. The actual variation ΔCD is in turn illustrated for five different field heights, wherein the profiles for the five field heights in FIG. 14 are shown by various dashed curves. The variation of the structure image size ΔCD is different for a plurality of field heights of 0. The structure image size variation ΔCD is additionally different for various field heights x. The result is a lower quality of the total aerial image relevant for the development of the light-sensitive layer on the wafer 22. The optimization to a homogeneous intensity distribution over the object field thus does not lead in this case to the desired result.

What is claimed is:

1. A method of operating a microlithography projection exposure apparatus comprising an illumination optical unit and a projection optical unit, the illumination optical unit comprising a correction device, the method comprising:
    ascertaining intensity distributions of individual imaging light partial beams in the illumination optical unit along a coordinate which is transverse to a scan direction of the illumination optical unit;
    ascertaining, in dependence on the transverse coordinate, an actual variation of actual values of structure image sizes of object structures in an image field of the projection optical unit which are formed by superposition of the imaging light partial beams in the image field; and
    displacing correction elements of the correction device so that the actual variation matches, within a tolerance bandwidth, a predetermined variation.

2. The method of claim 1, further comprising, before ascertaining the intensity distributions of the individual imaging light partial beams, determining the tolerance bandwidth.

3. The method of claim 1, wherein the individual imaging light partial beams comprise first and second imaging light partial beams, and displacing the correction elements influences the first imaging light partial beam differently from the second imaging light partial beam.

4. The method of claim 1, wherein the individual imaging light partial beams comprise first and second imaging light partial beams, and displacing the correction elements influences an intensity of the first imaging light partial beam differently from an intensity of the second imaging light partial beam.

5. The method of claim 1, further comprising, after displacing the correction elements, scanning a reticle and a wafer.

6. The method of claim 5, further comprising using the microlithography projection exposure apparatus to image the reticle onto the wafer.

7. The method of claim 1, wherein the structure image sizes of the object structures in the image field are constant.

8. The method of claim 1, wherein the correction elements comprise diaphragms.

9. The method of claim 1, wherein the correction elements are individually displaced.

10. The method of claim 1, further comprising:
    using the illumination system to illuminate an object in an object field of the projection optical unit with a plurality of individual light beams while: a) using the projection optical system to image the object into an image field of the projection optical unit; and b) displacing the object in the scan direction; and
    displacing the correction elements to adjust intensity distributions of at least some of the individual light beams to influence an imaging light intensity in a beam path upstream of the object field.

11. The method of claim 10, further comprising, before displacing the correction elements, determining the tolerance bandwidth.

12. The method of claim 10, wherein the value of the structure size image depending on the transverse coordinate is constant.

13. The method of claim 10, wherein, for at least two of the individual light beams, a projection of the individual light beam on the image plane is tilted about an axis perpendicular to both the displacement direction and the transverse direction.

14. A system, comprising:
a correction device comprising correction elements;
displacement actuators, each correction element having a corresponding displacement actuator configured to displace the correction element; and
a control device configured to be in signal communication with the displacement actuators;
a first device configured to be in signal communication with the displacement actuators, the first device configured to ascertain intensity distributions of individual imaging light partial beams along a first direction; and
a second device configured so that, when the system is used in a microlithography projection exposure apparatus comprising an illumination system and a projection optical unit, the second device ascertains an actual variation of actual values of structure image sizes of object structures in an image field of the projection optical unit, the object structures being formed by superposition of imaging light partial beams in the image field in dependence on the first direction.

15. The system of claim 14, wherein the correction elements are independently displaceable.

16. The system of claim 14, wherein the correction elements comprise a plurality of individual diaphragms arranged in a row along the first direction.

17. The system of claim 14, wherein the first device comprises an Aerial Image Metrology System (AIMS).

18. An illumination optical unit, comprising the system according to claim 14, wherein the illumination unit is a microlithography illumination unit.

19. An apparatus, comprising:
an illumination optical unit comprising the system of claim 14; and
a projection optical unit,
wherein the apparatus is a microlithography projection exposure apparatus.

20. A method comprising:
using a microlithography projection exposure apparatus to project at least some structures on a reticle onto a light sensitive layer applied to a wafer, the microlithography projection exposure apparatus comprising:
an illumination optical unit comprising the system of claim 14; and
a projection optical unit.

21. The method of claim 20, further comprising forming a structured component.

* * * * *